United States Patent
Tsutsumi

(10) Patent No.: US 7,382,435 B2
(45) Date of Patent: Jun. 3, 2008

(54) EXPOSURE APPARATUS

(75) Inventor: Ryosuke Tsutsumi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 11/395,132

(22) Filed: Apr. 3, 2006

(65) Prior Publication Data

US 2006/0221318 A1    Oct. 5, 2006

(30) Foreign Application Priority Data

Apr. 4, 2005   (JP)   ............................. 2005-107740
Mar. 30, 2006  (JP)   ............................. 2006-095855

(51) Int. Cl.
G03B 27/42       (2006.01)
(52) U.S. Cl. ..................... 355/53; 355/67; 355/72; 356/508; 356/510
(58) Field of Classification Search .................. 355/53, 355/67, 72, 75; 356/508, 510
See application file for complete search history.

(56) References Cited

U.S. PATENT DOCUMENTS 4,855,792 A * 8/1989 Holbrook et al. ............. 355/53
5,311,288 A * 5/1994 Shahar ........................ 356/623
5,461,237 A * 10/1995 Wakamoto et al. ......... 250/548

FOREIGN PATENT DOCUMENTS

JP    2001-015422    1/2001

* cited by examiner

Primary Examiner—Della J. Rutledge
(74) Attorney, Agent, or Firm—Fitzpatrick, Cella, Harper & Scinto

(57) ABSTRACT

An exposure apparatus which irradiates a photosensitive agent applied to a substrate to form a latent image pattern on the photosensitive agent. The exposure apparatus includes a substrate stage which drives the substrate, a focus measurement unit which obliquely irradiates the substrate with measurement light to measure the position of the substrate in the direction of the axis of the exposure beam on the basis of the light reflected by the substrate, and a controller which executes a calibration for correcting, on the basis of the measurement result obtained by the focus measurement unit, a track plane of the substrate stage with reference to the reference plane of the focus measurement unit so as to set the track plane parallel to the reference plane.

6 Claims, 8 Drawing Sheets

EXPOSURE APPARATUS

FIELD OF THE INVENTION

The present invention relates to an exposure apparatus which irradiates, with an exposure beam through a projection optical system, a photosensitive agent applied to a substrate to form a latent image pattern on the photosensitive agent.

BACKGROUND OF THE INVENTION

In manufacturing an electronic device, such as a semiconductor device, a reduction projection exposure apparatus, which reduction-projects a circuit pattern formed on a reticle (original plate) onto a wafer (substrate) coated with a photosensitive material (resist) to form a latent image pattern on the photosensitive agent, is applied.

In recent years, the mainstream of an exposure apparatus is a scanning exposure apparatus (scanner) as an improved product of a stationary exposure apparatus (stepper), which executes full-plate exposure of a reticle pattern for a shot region. The scanning exposure apparatus drives by scanning a reticle and a wafer with respect to an exposure beam formed into a slit shape through a slit to transfer a circuit pattern of the entire reticle onto the wafer. Since the stationary exposure apparatus executes full plate exposure for the shot region, it is difficult for this apparatus to perform focus/tilt correction within the shot. However, since the scanning exposure apparatus executes scanning exposure, it can follow a variation in local surface shape within the shot. This has a merit of averaging distortion in the scanning direction of a projection optical system.

As the degree of integration of semiconductor devices increases, a projection optical system of an exposure apparatus is demanded to realize a higher resolving power. In order to satisfy this demand, the wavelength $\lambda$ of an exposure beam for use must be shortened, or the numerical aperture NA must be increased. The resolution is given by $k1 \cdot \lambda / NA$ (k1 is a process constant). A higher resolution requires highly accurate focusing. The focus margin $\{d=k2 \cdot \lambda / NA^2\}$ becomes smaller year by year, and additionally, severe demands are imposed on components associated with focusing.

Typical factors of defocus caused in scanning exposure can be, for example, (1) a pattern offset measurement error which occurs due to a wafer having an asymmetric shape, such as a thickness variation or poor reproducibility in stage scanning, (2) a correction residue for an environmental factor, such as air fluctuations, a variation in air pressure, or a temperature variation, (3) a temporal variation in a measurement optical system, and (4) a correction residue for the lens aberration or exposure history due to exposure heat.

Three planes, i.e., the image plane (this image plane will also be referred to as the lens image plane hereinafter), in which a projection optical system forms a reticle image, the track plane (this scanning plane will also be referred to as the stage scanning plane hereinafter) of a predetermined portion (typically, the surface of a wafer chuck) of a moving wafer stage, and the reference plane (this reference plane will also be referred to as the OPTF reference plane hereinafter) of a compound-eyed focus sensor in an oblique incidence measurement optical system, which measures the focusing direction (Z direction) are not kept parallel to each other. This is a primary factor, which induces defocus in exposure.

The stage scanning plane largely varies upon reset, and its reproducibility decreases, so calibration must be performed so as to set the stage scanning plane parallel to the lens image plane or OPTF reference plane in reset. The variation in stage scanning plane upon reset is caused because the origin reproduction position of the stage is hard to stabilize. As the stage scanning plane varies upon reset, the stage scanning plane is set without being parallel to the lens image plane or OPTF reference plane.

Japanese Patent Laid-Open No. 2001-15422 discloses a technique for correcting the track of a stage driven along a polynomial surface of an N order function to the scanning plane expressed by linear components (plane). To cope with this, the amount of change in stage position in the focusing direction upon driving the stage is measured in advance to generate a correction table, thereby calculating the stage scanning plane with reference to the correction table. In the technique disclosed in Japanese Patent Laid-Open No. 2001-15422, in measurement for correction table generation, a wafer is arranged on the stage to measure the position of the wafer plane in the Z-axis direction.

SUMMARY OF THE INVENTION

The present invention has been made in consideration of the above situation, and has as its object to provide, e.g., a technique for setting the reference plane of a focus measurement unit parallel to the track plane of a stage.

According to the present invention, there is provided an exposure apparatus, which irradiates, with an exposure beam through a projection optical system, a photosensitive agent applied to a substrate to form a latent image pattern on the photosensitive agent, comprising a substrate stage which drives the substrate, a focus measurement unit which obliquely irradiates the substrate with measurement light to measure a position of the substrate in a direction of an axis of the exposure beam based on the light reflected by the substrate, and a controller which executes calibration for correcting, based on a measurement result obtained by the focus measurement unit, a track plane of the substrate stage with reference to a reference plane of the focus measurement unit, so as to set the reference plane parallel to the track plane, wherein the substrate stage includes a reference plate and the controller controls, when measurement for correcting the track plane of the substrate stage is to be executed by the focus measurement unit, a position of the substrate stage so as to irradiate the reference plate with the measurement light.

According to a preferred embodiment of the present invention, the focus measurement unit may include a plurality of channels. In this case, the controller can correct the track plane based on measurement results obtained by at least three channels of the plurality of channels.

According to the preferred embodiment of the present invention, the controller can cause, while positioning the substrate stage at a plurality of positions in turn, the focus measurement unit to execute measurement at each position.

According to the preferred embodiment of the present invention, the controller can execute calibration in response to a reset request to the exposure apparatus.

According to the preferred embodiment of the present invention, the exposure apparatus may further comprise a stage base which supports the substrate stage, and a static pressure guide which levitates the substrate stage on the stage base. In this case, the controller can execute calibration as the static pressure guide is switched from an inactive state to an active state.

According to the preferred embodiment of the present invention, the exposure apparatus can be configured as a scanning exposure apparatus.

The present invention can provide, e.g., a technique for setting the reference plane of a focus measurement unit parallel to the track plane of a stage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described below with reference to the accompanying drawings.

Figure 1:
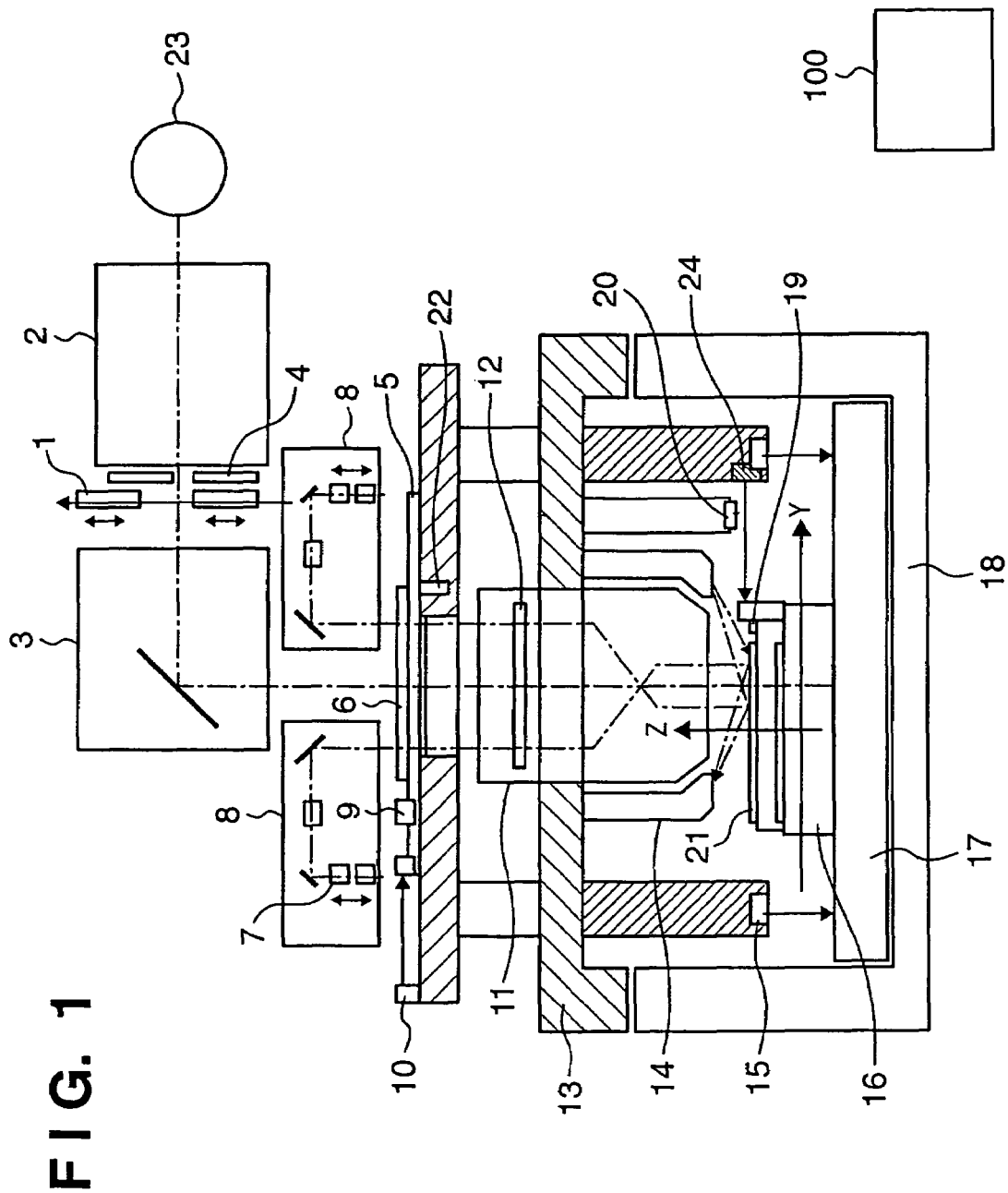
FIG. 1 is a view showing the schematic structure of a scanning exposure apparatus according to a preferred embodiment of the present invention.

An exposure apparatus according to the present invention is constituted as an apparatus, which irradiates, with an exposure beam through a projection optical system, a photosensitive agent applied to a wafer (substrate) to form a latent image pattern on the photosensitive agent. FIG. 1 is a view showing the schematic structure of a scanning exposure apparatus according to a preferred embodiment of the present invention. An exposure beam emitted from a light source unit 23, such as an excimer laser, reaches a slit 4 via a first condenser lens group 2. The slit 4 shapes the exposure beam into a slit-like beam having a width of about 7 mm in the Z-axis direction. The slit 4 adjusts the exposure beam, such that an illuminance integrated along the Z-axis direction becomes uniform over a predetermined range in the X-axis direction.

When the pattern of a reticle 6 is to be transferred onto the photosensitive agent on a wafer 21, while scanning a reticle stage (original plate stage) 5 and wafer stage (substrate stage) 16, a masking blade 1 moves while following the edge of the angle of view of the pattern of the reticle (original plate) 6. The reticle stage 5 decelerates when the pattern of the reticle 6 is completely transferred. During this time, the masking blade 1 prevents the exposure beam from striking a light transmitting portion of the reticle 6 and being projected onto the wafer 21.

The exposure beam having passed through the masking blade 1 is applied to the reticle 6 on the reticle stage 5 via a second condenser lens group 3. The exposure beam having passed through the pattern of the reticle 6 forms the imaging plane of the pattern around the surface of the wafer (substrate) 21 through a projection lens (projection optical system) 11. An NA stop 12 is provided in the projection lens 11, so as to change the illumination mode in exposure.

A TTL scope 8 which is one-dimensionally movable, measures, with reference to its reference absolute position, the positions along the X-, Y-, or Z-axis direction of alignment marks formed on the reticle 6 and those formed on the wafer 21 or a reference mark plate 19 on the wafer stage 16. A relay lens 7 is used to adjust the focus of the TTL scope 8. Referring to the position of the relay lens 7 when the alignment marks are in in-focus makes it possible to measure the focus (the position along the Z axis direction) of the detection target.

Referring to FIG. 1, the two TTL scopes 8 are arranged along the Y axis direction in the drawing. In fact, however, another TTL scope is arranged along the X-axis direction. With this arrangement, the gradient along the ωx and ωy directions between reticle alignment marks, and marks on the wafer 21 or marks 201 formed on the wafer reference mark plate 19, can be measured. The two TTL scopes 8 shown in FIG. 1 can be driven in the direction toward the center of the angle of view (Y-axis direction) of the exposure beam.

To adjust the focus of the TTL scope 8, the reticle stage 5 is driven so as to allow the TTL scope 8 to observe a reticle reference plate 9 on the reticle stage 5, and the TTL scope 8 is moved at the measurement mark position on the reticle reference plate 9. In a normal exposure sequence, the TTL scope 8 retreats outside the angle of view of the exposure beam so as not to disturb exposure. In this embodiment, for example, each of the two TTL scopes 8 having retreated in the longitudinal direction (X-axis direction) of the slit-shaped exposure beam moves in the direction toward the center of the field, and the TTL scope 8 having retreated in the widthwise direction (Y-axis direction) of the exposure beam moves in the direction toward the center of the field. The TTL scope 8 observes marks 202 on the reticle reference plate 9 on the reticle stage 5.

Figure 2:
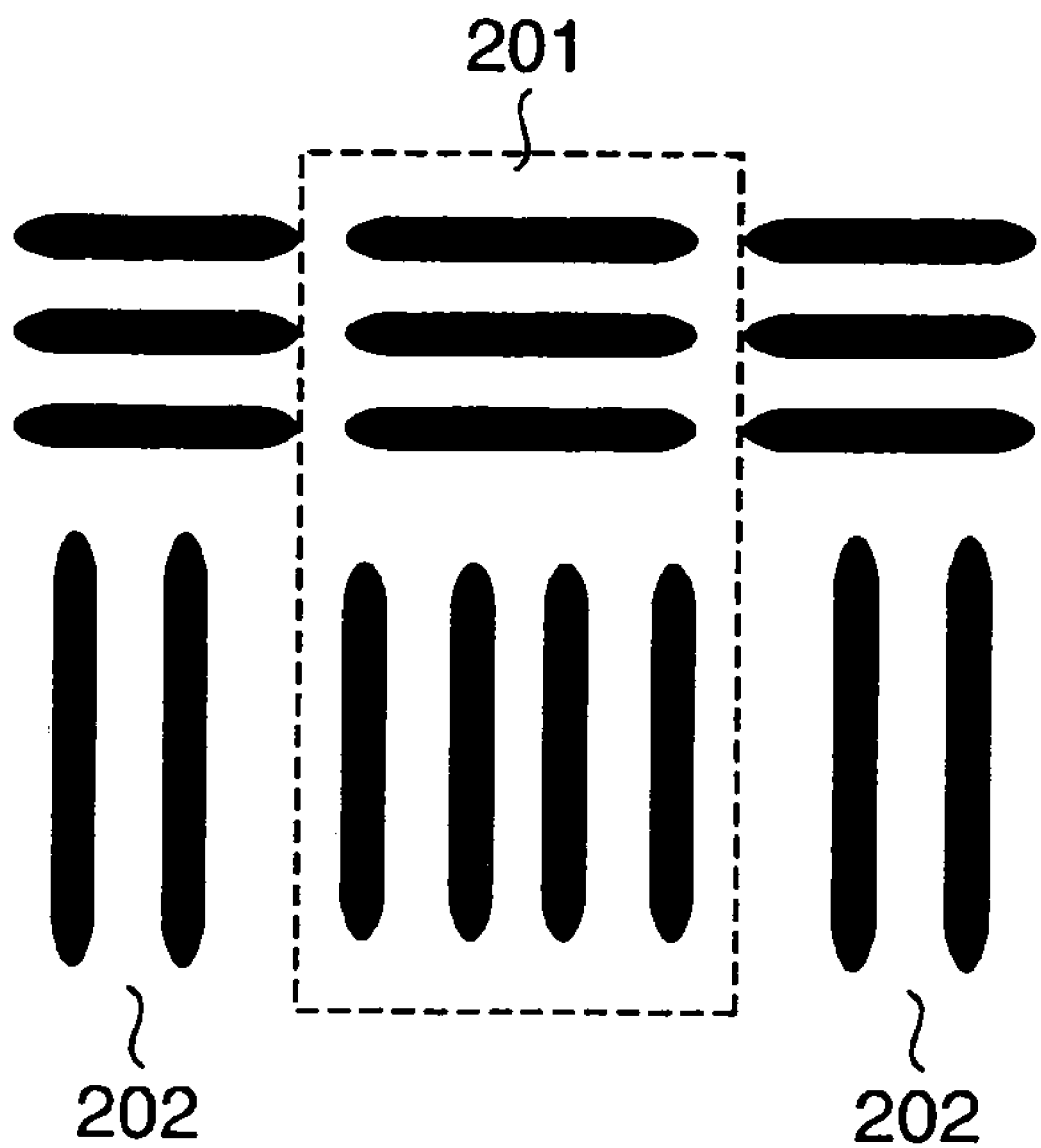
FIG. 2 is a view illustrating marks which can be used in a process of, e.g., setting the lens image plane parallel to the stage scanning plane.

The marks 202 on the reticle reference plate 9 have a pattern illustrated in FIG. 2. The marks 202 formed on the reticle reference plate 9 can be considered to be located at positions almost equivalent to the reticle pattern plane in the Z-axis direction. Therefore, the focus of the marks 202 represents the focus position of the circuit pattern formed on the reticle. As the marks 202 are observed by the TTL scope 8, the relay lens 7 is driven so as to set the TTL scope 8 in a best focus state in which maximum contrast is attained. With the above process, best focus positions of the three TTL scopes 8 are matched with the plane of the marks 202 formed on the reticle reference plate 9.

The TTL scope 8 is also used in a process of correcting the scanning plane (track plane) of the wafer stage 16 to be parallel to the image plane of the projection lens 11. The wafer stage 16 is driven to a position where the TTL scope 8 is allowed to observe the marks 201 formed on the reference mark plate 19 arranged on the wafer stage 16, as in the case of the measurement marks 202 formed on the reticle reference plate 9. The marks 201 formed on the reticle reference plate 9 of the reticle stage 5 and those formed on the reference mark plate 19 of the wafer stage 16 have a pattern illustrated in FIG. 2 and can be simultaneously observed by the TTL scope 8.

The marks 201 and 202 are arranged at two points of the reference plates 9 and 19, so that they fall within the fields of view of the two TTL scopes arranged along the longitudinal direction (X-axis direction) of the slit shaped exposure beam. With this arrangement, the inclination amounts of the reticle stage 5 and projection lens 11 can be measured.

The wafer stage 16 is slightly driven in the Z-axis direction so as to obtain maximum contrast of the observed marks. On the basis of the mark span and the measurement difference of the marks respectively measured by the two TTL scopes 8, the relative inclination (difference) between the lens image plane (the image plane of the projection lens 11) and the stage scanning plane (the track plane of a predetermined portion of the wafer stage 16 when the wafer stage 16 moves) can be calculated. On the basis of the obtained relative inclination, data for driving the wafer stage 16 can be corrected so as to set the lens image plane parallel to the stage scanning plane.

The reticle stage 5 is controlled in the X, Y, and θ directions using three reticle laser interferometers 10. Referring to FIG. 1, only one reticle laser interferometer 10 is shown. In fact, however, two laser interferometers 10 are arranged in the Y-axis direction, and one laser interferometer 10 is arranged in the X-axis direction with respect to the two laser interferometers 10. The reticle stage 5 is movable in the X, Y, and θ directions along a guide arranged on a lens barrel base 13. The reticle stage 5 is movable along the Y-axis over a long stroke to perform scanning exposure as it moves in synchronism with the wafer stage 16. The reticle stage 5 is movable along the X- and θ-axes only within a small range, only as long as an error caused upon making the reticle stage 5 chuck the reticle 6 by vacuum suction can be cancelled.

The exposure apparatus has a structure in which a reaction force acting upon driving the reticle stage 5 is released into a reaction force absorption unit (not shown) tightly connected to a base plate 18. Therefore, no vibration due to a driving reaction is conducted to the lens barrel base 13. The above-described reticle reference plate 9 is mounted on the reticle stage 5.

OPTF measurement is executed using a focus measurement unit 14. The focus measurement unit 14 obliquely irradiates the measurement target (wafer) with measurement light emitted from a light-projecting unit, including a light-emitting element, such as a laser diode. The focus measurement unit 14 then causes a light-receiving unit including an image sensing element to receive the light reflected by the measurement target. The position of a reflected light spot formed in the image sensing plane of the image sensing element depends on the position of the measurement target (wafer) in the focusing direction (Z-axis direction; the direction of the axis of the exposure beam). The focus measurement unit 14 detects, e.g., the barycentric position of the reflected light spot to obtain the focus value at a position where the measurement light enters the measurement target (wafer).

In OPTF measurement using the focus measurement unit 14, the position of the wafer 21 or reference mark plate 19, which is mounted on the wafer stage (substrate stage) 16, without passing through the projection lens 11, in the Z, ωx, and ωy directions, can be measured at high speed regardless of the presence/absence of the marks.

In focus detection when exposure is to be performed while synchronously scanning the reticle stage 5 and wafer stage 16, the focus measurement unit 14 is used. To guarantee long-term stability of the measurement accuracy, the focus measurement unit 14 executes self calibration by comparing the result obtained by causing the TTL scope 8 to measure the marks 201 formed on the reference mark plate 19, arranged on the wafer stage 16, with the measurement result obtained by the focus measurement unit 14 itself.

An off-axis scope 20 includes a focus measurement function by a single eye and an alignment error measurement function in the X and Y directions. When the wafer is to be aligned in a normal mass production job, the off-axis scope 20 executes both global tilt measurement and global alignment measurement. Global tilt correction and global alignment correction are simultaneously executed when the wafer stage 16 is moved step by step so as to position the exposure area of the wafer under the projection lens 11.

The lens barrel base 13 serves as a base to attach the high-precision measurement units of the exposure apparatus. The lens barrel base 13 is aligned while being levitated by a static pressure guide by a small amount above the base plate 18 directly installed on a floor. Since the focus measurement unit 14 and TTL scope 8 are attached to the lens barrel base 13, the measurement values obtained by them are equivalent to the relative distances from the lens barrel base 13.

An inter-base interferometer 15 measures the relative positional relationship between the lens barrel base 13 and a stage base 17. In this embodiment, in scanning exposure, the sum of the measurement result obtained by the inter-base interferometer 15 and the measurement result obtained by a Z sensor of three axes (not shown), mounted on the wafer stage 16, is controlled to be matched with the target value by a controller 100. Similar to the interferometers for the reticle stage 5, three wafer stage interferometers 24 are arranged and used to control the wafer stage 16 in the X, Y, and θ directions.

The stage base 17 is aligned while being levitated by a static pressure guide by a small amount from the base plate 18. The stage base 17 has a function of removing vibration conducted from the floor to the wafer stage 16 via the base plate 18, and a function of reducing a reaction force acting upon driving the wafer stage 16 to release it into the base plate 18. The wafer stage 16 is mounted on the stage base 17, while being levitated by a small distance.

A reticle focus measurement unit 22 measures a position in the focusing direction of the pattern plane of the reticle 6 chucked and held by the reticle stage 5. The reticle focus measurement unit 22 is a focus measurement sensor using a plurality of measurement points arranged in a direction (the X-axis direction) perpendicular to the sheet surface in FIG. 1. As the measurement method, for example, the reticle focus measurement unit 22 can adopt a method of measuring the barycentric position of the reflected light, as with the focus measurement unit 14. As the reticle stage 5 moves to a position in the Y direction, which can be measured by the reticle laser interferometer 10, it is possible to measure the focus of the reticle pattern plane at an arbitrary position in the Y direction.

The focus measurement information of the measured reticle plane is stored in a storage unit in the controller 100, and used to correct the target position track of the wafer stage 16 in the focusing/tilting direction, which scans the wafer 21 in the exposure process.

Figure 3B:
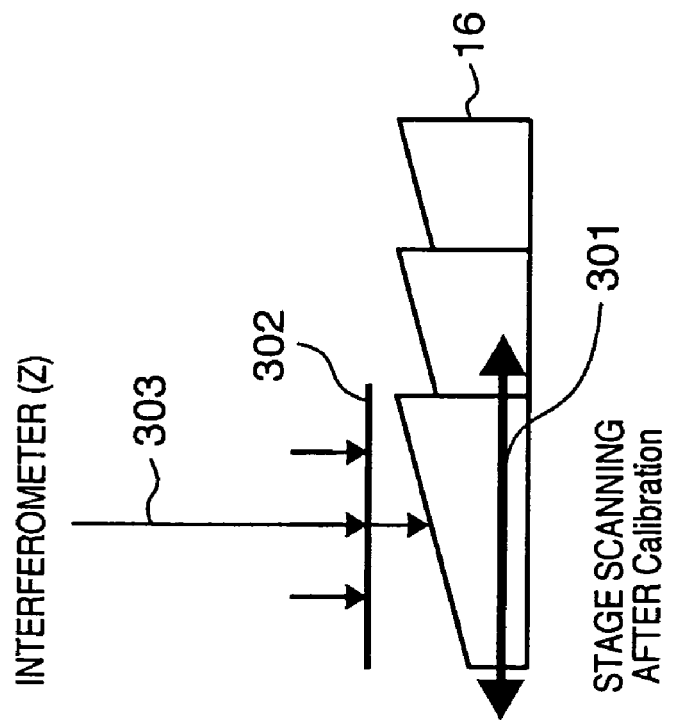
FIGS. 3A and 3B are conceptual views showing calibration for correcting the stage scanning plane to be parallel to the OPTF reference plane in the scanning exposure apparatus according to the preferred embodiment of the present invention.
Figure 3A:
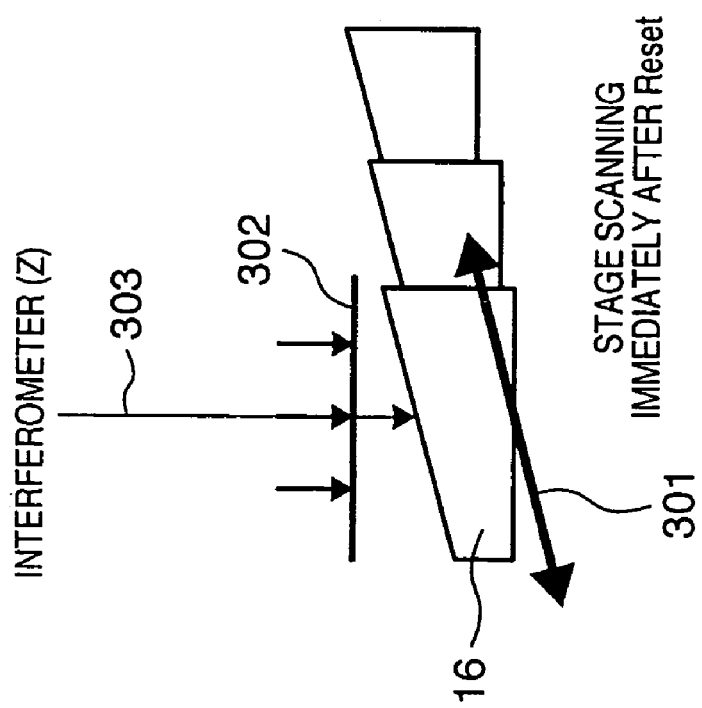

FIGS. 3A and 3B are conceptual views showing calibration for correcting the stage scanning plane to be parallel to the OPTF reference plane in the scanning exposure apparatus according to the preferred embodiment of the present invention. A method of setting an OPTF reference plane 302 as the reference of calibration requires that the OPTF reference plane 302 should not vary upon reset. The present applicant confirmed that the OPTF reference plane 302 drifts so moderately that the movement is acceptable as long as it is adjusted by periodic maintenance (e.g., once a week). The OPTF reference plane 302 varies due to a factor, which requires a long interval, such as a temporal variation, so it hardly drifts.

Even if the OPTF reference plane 302 drifts, when calibration is performed using the marks 202 as has been described with reference to FIG. 2, the relative inclination of the OPTF reference plane 302 to the lens image plane (the image plane of the projection lens 11) can be measured. When such inspection is periodically performed, it is possible to set the OPTF reference plane 302 as the reference plane of the apparatus.

On the other hand, the inclination (indicating how parallel the stage scanning plane is with respect to the OPTF reference plane) of a stage scanning plane 301 is not reproducible immediately after reset. However, the stage scanning plane 301 does not become parallel to the OPTF reference plane 302, as schematically shown in FIG. 3A. To solve this problem, calibration is performed so as to set the stage scanning plane 301 parallel to the OPTF reference plane 302, as schematically shown in FIG. 3B. If the wafer surface is desired to be set parallel to the OPTF reference plane 302, global tilt measurement is executed to correct the wafer surface to be parallel to the stage scanning plane 301. More specifically, the wafer stage 16 is driven to execute focus measurement at several points on the wafer surface by using a central channel (central sensor) of the focus measurement unit 14, thereby measuring the difference between the wafer surface and the stage scanning plane 301. The correction amount can be obtained on the basis of the measured difference.

The exposure apparatus may have a function of coping with an error caused when the measurement value obtained by global tilt measurement exceeds an allowable value. The exposure apparatus may also have an interface to select whether to perform calibration in reset.

The inclination of the stage scanning plane is not reproducible immediately after reset, as described above. However, the shape of the stage scanning plane has a relatively high reproducibility, because it copies the shape of the stage base 17 shown in FIG. 1.

Figure 4:
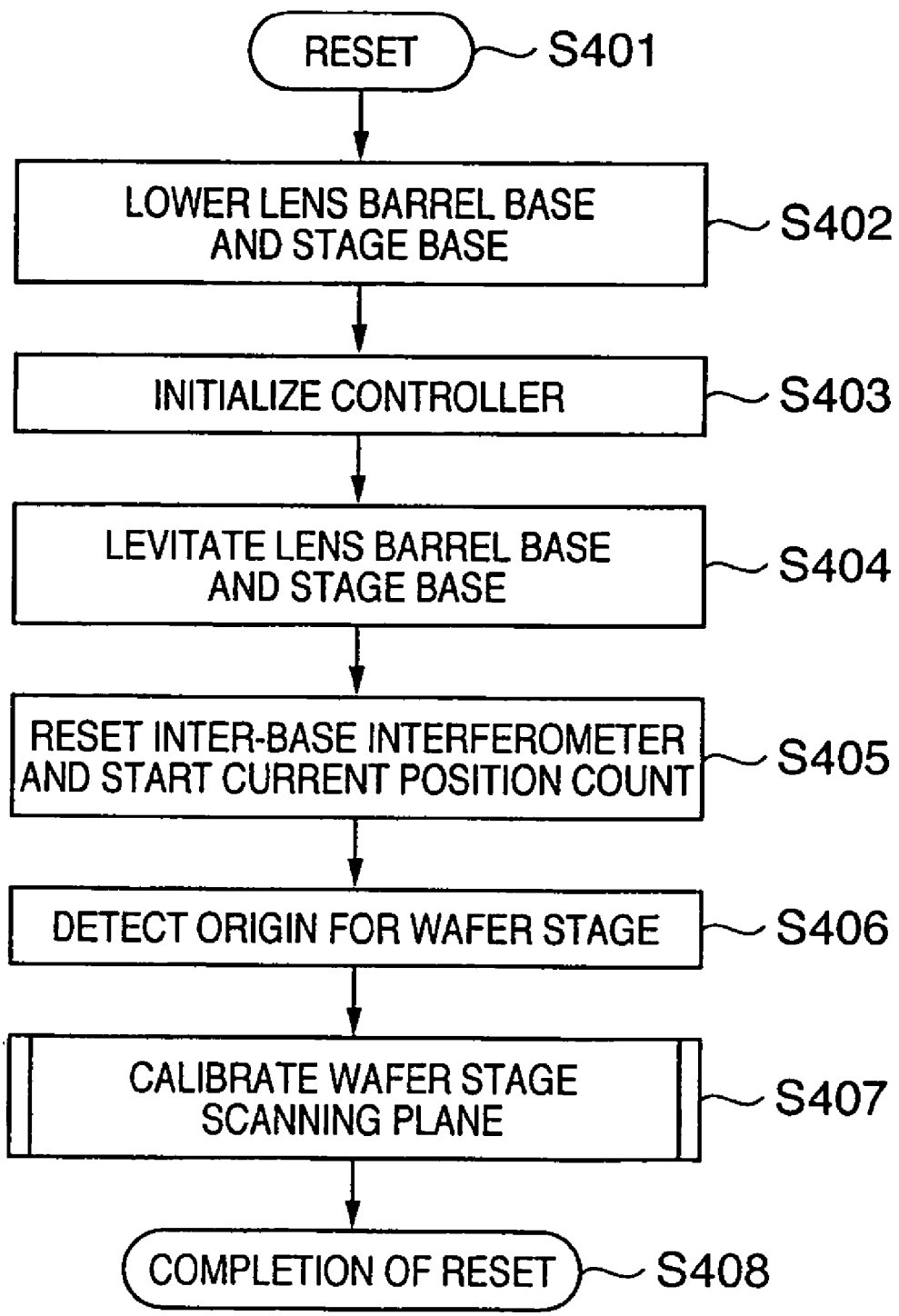
FIG. 4 is a flowchart showing a reset sequence in the scanning exposure apparatus according to the preferred embodiment of the present invention.

FIG. 4 is a flowchart showing a reset sequence in the scanning exposure apparatus according to the preferred embodiment of the present invention. This sequence is controlled by the controller 100. Since the lens barrel base 13 and stage base 17 are levitated by the static pressure guides, they fall when reset is instructed and power supply to the static pressure guides is cut off (step 402). After the controller 100 is initialized (step 403), power is supplied to the static pressure guides of the lens barrel base 13 and stage base 17, thereby levitating them (step 404). After that, the inter base interferometer 15 attached to the lens barrel base 13 is reset and count (measurement) of the current position is started (step 405).

As described above, when reset is executed, the mechanical reproducibility of the stage base 17 is decreased, so the stage scanning plane varies. As a result, the reproducibility of the stage scanning plane is also decreased. Furthermore, as the two bases 13 and 17 are controlled to fall upon resetting or levitation, they vibrate on the order of, e.g., several micrometers (typically, about ±1 μm). For this reason, it is difficult to start a position count while the lens barrel base 13 is set parallel to the stage base 17. Accordingly, the stage scanning plane, which should be calibrated to be parallel to the stage base 17, is influenced by vibration and varies. Since the lens barrel base 13 has the inter base interferometer 15, it can be considered to be stationary on the exposure apparatus. The origin of the projection lens 11 is detected (step 406), and the wafer stage scanning plane is calibrated as described hereinafter (step 407). Reset is thus completed.

Figure 5:
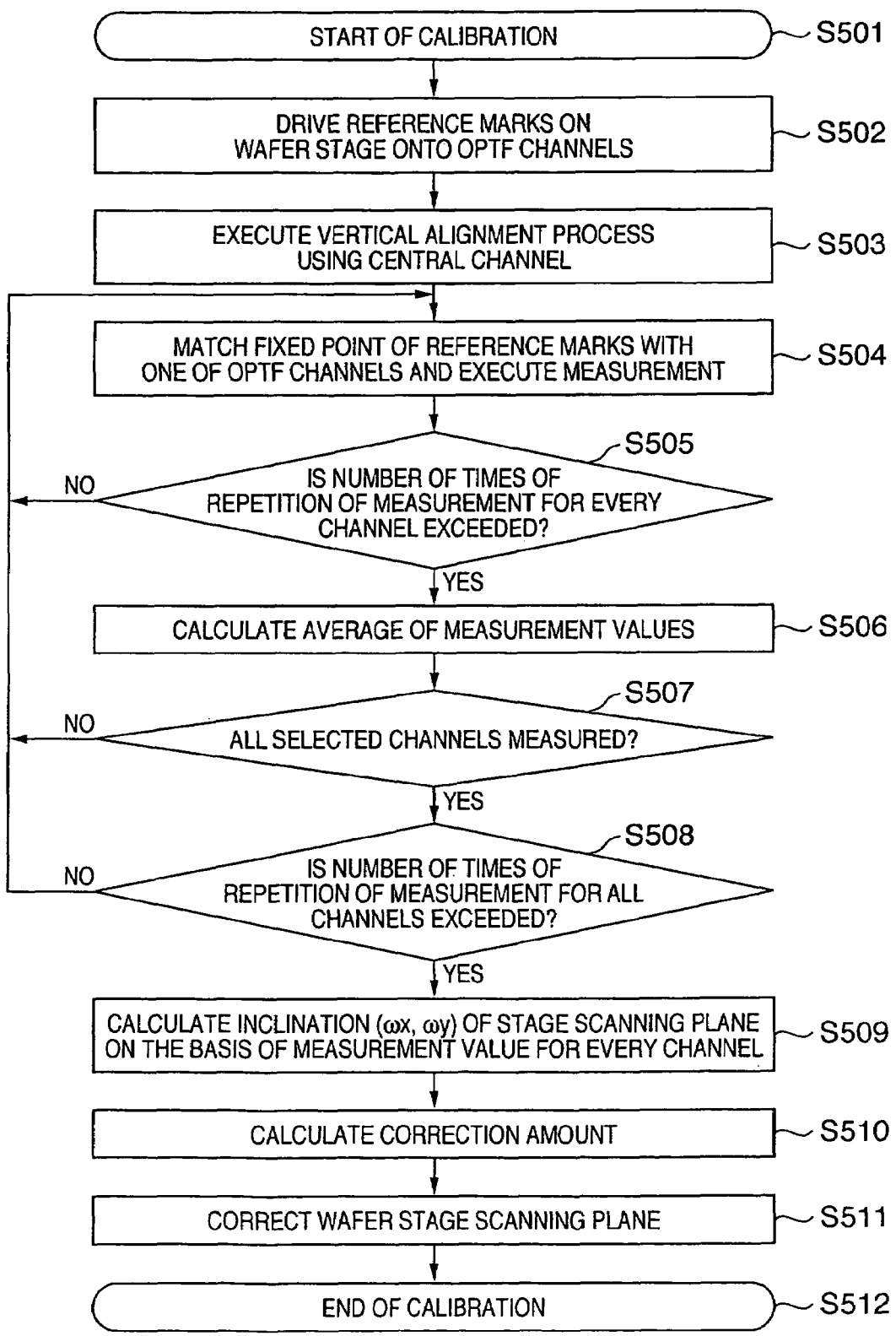
FIG. 5 is a flowchart showing a sequence for calibrating the wafer stage scanning plane in the scanning exposure apparatus according to the preferred embodiment of the present invention.

FIG. 5 is a flowchart showing a sequence for calibrating the wafer stage scanning plane in the scanning exposure apparatus according to the preferred embodiment of the present invention. This sequence is controlled by the controller 100. When calibration execution is required upon reset execution, calibration starts (step 501). Calibration shown in FIG. 5 need not necessarily be executed upon reset. Calibration may be executed in the initialization sequence, at a predetermined time interval, in the programmed time, at the start or during the execution of a job, in an environmental variation of the apparatus, such as exchange of the wafer or reticle, or at other timings.

Figure 6:
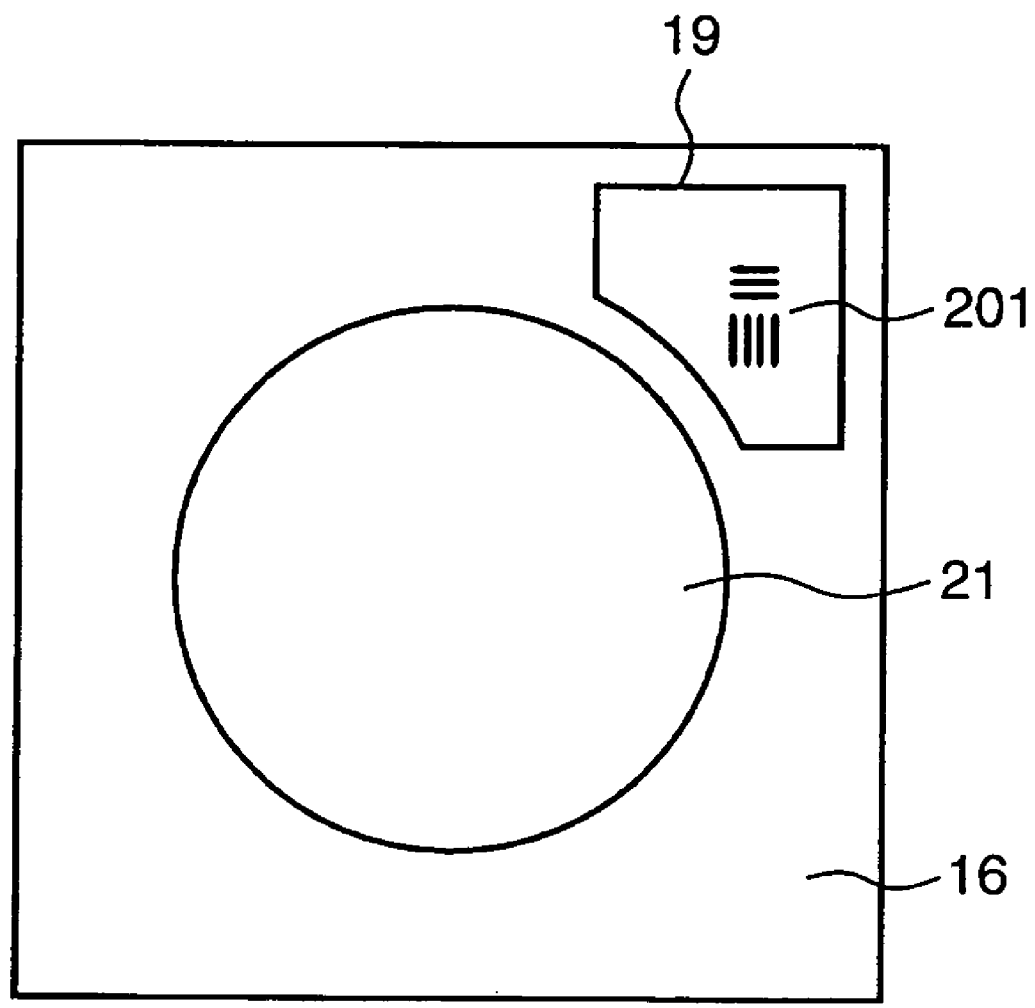
FIG. 6 is a view illustrating a wafer stage and a wafer, and a reference mark plate arranged on the wafer stage.

As illustrated in FIG. 6, the marks 201 formed on the reference mark plate 19 arranged outside the wafer 21 on the wafer stage 16 are driven to a position under the vicinity of the center of the projection lens 11, where OPTF channels are present (step 502).

Figure 7:
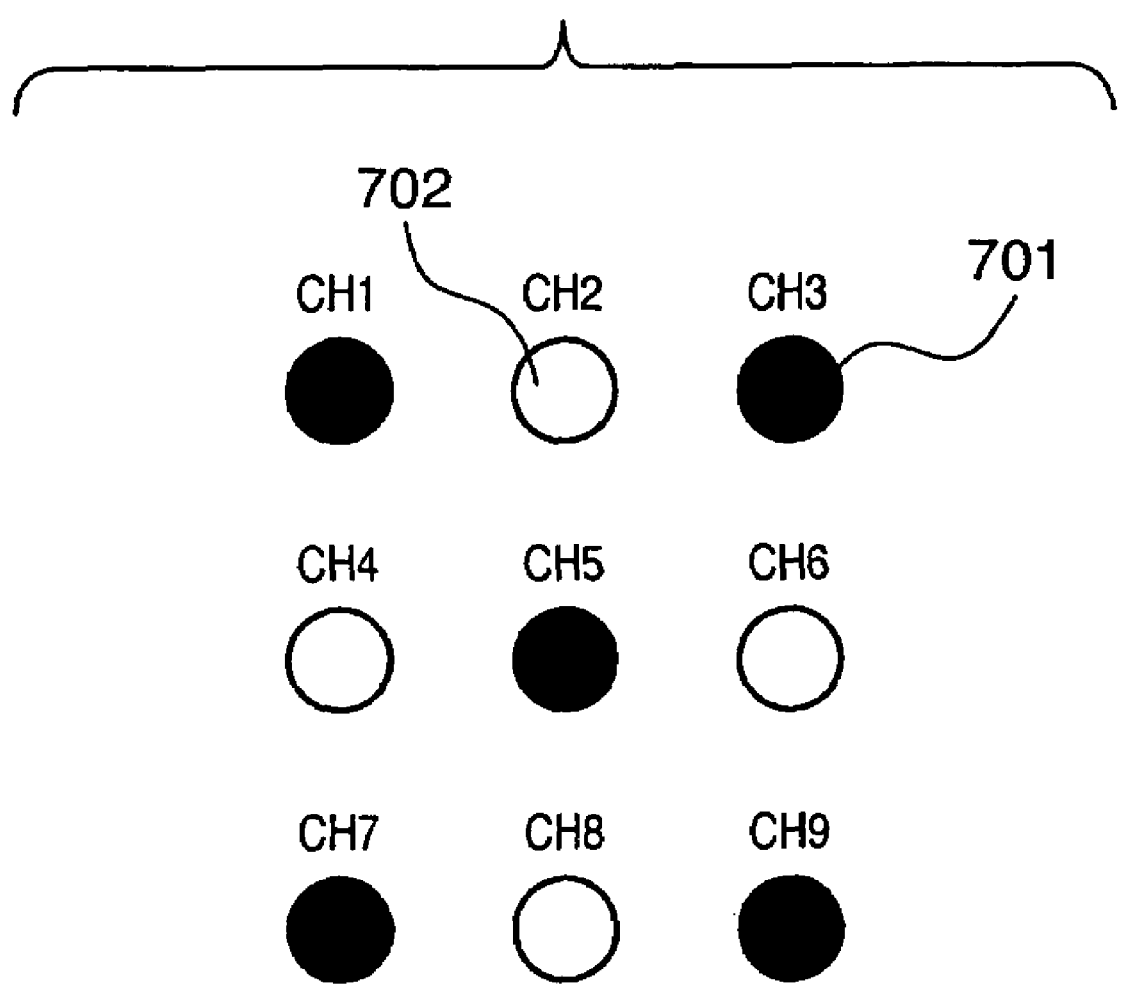
FIG. 7 is a view illustrating the channel configuration of a compound eyed focus measurement unit.

In this embodiment, as illustrated in FIG. 7, the focus measurement unit 14 has a plurality of OPTF channels (sensors). It suffices as long as the inclination of the stage scanning plane can be detected in calibration. For example, at least three channels of all the channels of the focus measurement unit 14 can be selected and used, as illustrated in FIG. 7. In the example shown in FIG. 7, solid circles represent measurement target channels 701 and open circles represent non measurement target channels 703, and five OPTF channels are used.

A vertical alignment process (alignment in the Z direction) is executed by the central OPTF channel (the channel CH5 in FIG. 7) (step 503). In the vertical alignment process, for example, the central channel CH5 is used to drive the wafer stage 16 until the OPTF measurement value reaches the origin 0, thus preventing an OPTF measurement error as a focus factor.

A preset fixed point of the marks 201 is aligned with respect to the measurement region of one channel of at least three channels selected from the plurality of OPTF channels of the focus measurement unit 14 to measure a distance (position) in the focusing direction (Z-axis direction) (a smaller number of selected channels requires a shorter calibration time).

Measurement is performed at a number of times set for every channel (step 505). After that, the average value of the measurement values corresponding to the set number of times is calculated and defined as the measurement value obtained by the channel (step 506). If an abnormal measurement value is detected during measurement due to a step error, a focus measurement error, or a foreign substance on the marks 201, the apparatus may advance to the next step without using this measurement value. Alternatively, a function of inhibiting execution of the exposure job may be prepared.

Measurement is repeated by driving the wafer stage 16 so as to match the fixed point of the marks 201 with the measurement regions of selected channels until OPTF measurement by the channels is completed (step 507; in the example of FIG. 7, the loop in step 507 is performed five times because five channels are used for measurement). In channel selection, at least three channels, which are not present in a straight line, need to be selected. The maximum selection number is the number of channels of the focus measurement unit 14.

In step 504, assume that the focus measurement unit 14 has the channel configuration shown in FIG. 7 and uses the channels CH1, CH3, CH5, CH7, and CH9. If measurement starts from the central channel CH5, the order of channel selection can be determined as CH5→CH3→CH1→CH7→CH9→CH5. In this case, the channel CR5 is used at the first and last. In this manner, measurement using the same channel is performed again in the measurement loop. This makes it possible to calculate the difference between the measurement values obtained by the same channel at different timings. The measurement drift of the OPTF reference plane is detected from the difference, so it can be utilized for determining the reliability of OPTF measurement.

As described above, the number of times of execution of step 505 can be determined for every channel used for measurement (step 508). In the above example, step 505 is executed twice for the channel CH5 and executed only once for the channels CH1, CH3, CH5, CH7, and CH9. If step 505 is executed a plurality of number of times using the same channel, the average value of the measurement values obtained by measurement executed the plurality of number of times may be calculated and used.

If the difference between the measurement values obtained by using the same channel does not fall within an allowable amount, OPTF measurement may be tried again using all the channels or predetermined channels. Alternatively, the process may be terminated due to an error.

When a constant measurement value is detected from every OPTF channel upon measurement, it is determined that the stage scanning plane has already been positioned parallel to the OPTF reference plane. Subsequent calculation and correction processes (step 509 to step 511) may be bypassed.

The inclination of the wafer stage scanning plane along the X and Y directions is calculated by using the OPTF measurement values measured in steps 504 to 508 (step 509). When the number of channels is larger than three, the primary plane can be calculated using a statistical process by a method, such as a least squares approximation, to obtain the inclination.

The respective correction amounts in the X and Y directions can be calculated on the basis of the inclination (the inclination with respect to the OPTF reference plane) of the stage scanning plane along the X and Y directions, which is obtained in step 509 (step 510).

The inclination of the stage scanning plane of the wafer stage 16 is corrected to set the stage scanning plane parallel to the OPTF reference plane by using the correction values obtained in step 510 (step 511). A series of processes for calibration is thus ended (step 512). After the calibration is completed, the fixed point used in measurement may be measured again using several OPTF channels to check a variation in resultant measurement value, thereby determining success or failure of calibration. If the variation such as $3\sigma$ statistically obtained from the measurement value exceeds a certain threshold value, it is determined that calibration has failed. The user can be notified of this failure. At this time, it is more effective to select, as a channel to be used for re-measurement, a non-measurement target OPTF channel 702, which is not used in this measurement.

Figure 8:
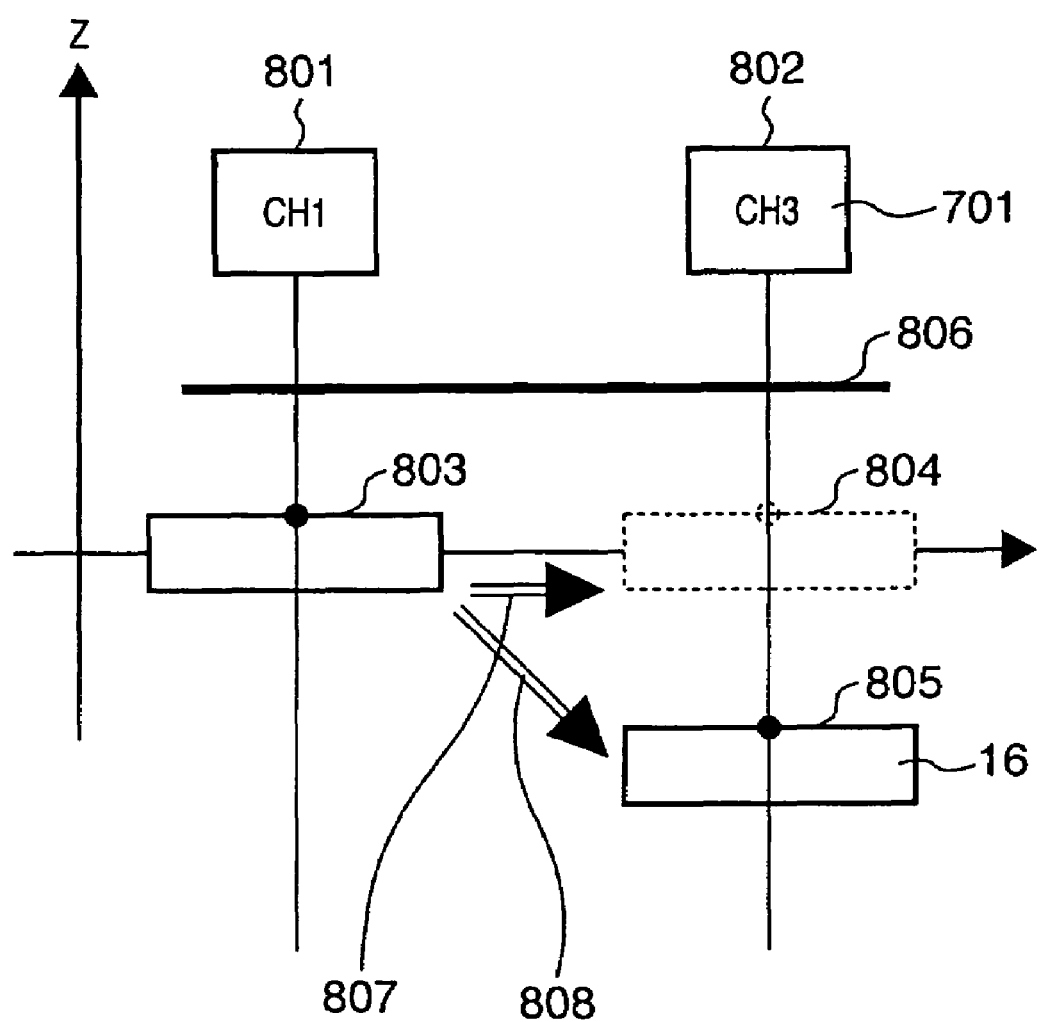
FIG. 8 is a conceptual view representing the influence of the stage scanning plane on the OPTF measurement value upon driving the wafer stage.

FIG. 8 is a conceptual view representing the influence of the stage scanning plane (807 or 808) on the OPTF measurement value upon driving the wafer stage 16. The wafer stage 16 (803 in FIG. 8) is driven so as to match the fixed point of the marks 201 on the wafer stage 16 with the measurement region of the OPTF channel CH1 (801), thereby measuring the OPTF value. Let $Z\_1$ be the measurement value of the channel CH1 (801) at this time.

The wafer stage 16 (804 in FIG. 8) is driven so as to match the fixed point of the marks 201 with the measurement region of the channel CH3 (802). Letting $Z\_3\_4$ be the measurement value of the channel CH3 (802) when the stage scanning plane 807 is parallel to an OPTF reference plane 806, $Z\_1=Z\_3\_4$. Therefore, the OPTF reference plane 806 is guaranteed to be parallel to the primary region of the stage scanning plane 807.

To the contrary, assume that the OPTF reference plane 806 is not parallel to the stage scanning plane 808. Letting $Z\_3\_5$ be the measurement value of the channel CH3 (802), $Z\_1$ is not equal to $Z\_3\_5$, as indicated by the wafer stage 16 (805 in FIG. 8). Therefore, it is obvious that the stage scanning plane 808 is not parallel to, but is inclined with respect to the OPTF reference plane 806.

As described above, if the OPTF reference plane 806 is not parallel to the stage scanning plane 808, driving data needs to be corrected so as to drive the wafer stage 16 to a position 804 in FIG. 8 in driving the wafer stage from the channel CH1 (801) to the channel CH3 (802). When the above measurement process is executed for several channels, it is possible to precisely measure and to calculate the inclination of the stage scanning plane with respect to the OPTF reference plane, thus correcting the overall stage scanning plane.

In the above-described embodiment, the inclination of the stage scanning plane is measured by the focus measurement unit 14 consisting of a plurality of channels (compound eye). Instead, a focus measurement unit consisting of a single channel (single eye) can be adopted. When the focus measurement unit consisting of a single channel (single eye) is adopted, the controller 100 may cause, while aligning the wafer stage 16 to a plurality of positions in turn, the focus measurement unit to execute measurement at each position.

With the above processes, the wafer stage scanning plane obtained upon scanning can be set to be parallel to the OPTF reference plane.

As described above, according to the preferred embodiment of the present invention, the scanning exposure apparatus is provided with a function of correcting the scanning plane of the wafer stage to be parallel to the OPTF reference plane as the reference plane of the focus. This makes it possible to improve the control accuracy of focus/tilt, thus realizing a scanning exposure apparatus, which copes with micropatterning.

Also, according to this embodiment, calibration need not be executed to guarantee the lens image plane to be parallel to the stage scanning plane in reset. Therefore, a shorter reset time is attained.

Also, according to this embodiment, the scanning exposure apparatus is provided with a function of setting, in calibration, channels for use of all the channels of a focus detector having a plurality of channels. This makes it possible to set channels for use in response to a request, such as a request for a higher accuracy or higher speed.

Moreover, using three or more channels makes it possible to realize calibration with high accuracy in both the ωx and ωy directions.

When the stage scanning plane varies upon reset, calibration should be executed in reset. However, to cope with a temporal variation, a variation caused by the turn of a process, or an unexpected variation, calibration can be executed at arbitrary timings, such as the start of a job or an exchange of a wafer or reticle.

As many apparently widely different embodiments of the present invention can be made without departing from the spirit and scope thereof, it is to be understood that the invention is not limited to the specific embodiments thereof, except as defined in the appended claims.

This application claims the benefit of Japanese Patent Application No. 2005 107740, filed on Apr. 4, 2005, and No. 2006-095855, filed on Mar. 30, 2006, which are hereby incorporated by reference herein in their entirety.

The invention claimed is:

1. An exposure apparatus which irradiates, with an exposure beam through a projection optical system, a photosensitive agent applied to a substrate to form a latent image pattern on the photosensitive agent, said apparatus comprising:

a substrate stage which drives the substrate;

a focus measurement unit which obliquely irradiates the substrate with measurement light to measure a position of the substrate in a direction of an axis of the exposure beam based on the light reflected by the substrate; and a controller which executes calibration for correcting, based on a measurement result obtained by said focus measurement unit, a track plane of said substrate stage with reference to a reference plane of said focus measurement unit so as to set the track plane parallel to the reference plane, wherein said substrate stage includes a reference plate and said controller controls, when measurement for correcting the track plane of said substrate stage is to be executed by said focus measurement unit, a position of said substrate stage so as to irradiate said reference plate with the measurement light.

2. The apparatus according to claim 1, wherein said focus measurement unit includes a plurality of channels and said controller corrects the track plane based on measurement results obtained by at least three channels of said plurality of channels.

3. The apparatus according to claim 1, wherein said controller causes, while positioning said substrate stage at a plurality of positions in turn, said focus measurement unit to execute measurement at each position.

4. The apparatus according to claim 1, wherein said controller executes calibration in response to a reset request to the exposure apparatus.

5. The apparatus according to claim 1, further comprising:

a stage base which supports said substrate stage; and a static pressure guide which levitates said substrate stage on said stage base, wherein said controller executes calibration as said static pressure guide is switched from an inactive state to an active state.

6. The apparatus according to claim 1, wherein the exposure apparatus is configured as a scanning exposure apparatus.

* * * * *

UNITED STATES PATENT AND TRADEMARK OFFICE
CERTIFICATE OF CORRECTION

| | |
|---|---|
| PATENT NO. | : 7,382,435 B2 |
| APPLICATION NO. | : 11/395132 |
| DATED | : June 3, 2008 |
| INVENTOR(S) | : Ryosuke Tsutsumi |

It is certified that error appears in the above-identified patent and that said Letters Patent is hereby corrected as shown below:

COLUMN 4:
    Line 24, "in in-focus" should read -- in focus, --.

COLUMN 7:
    Line 7, "should" should be deleted.

COLUMN 8:
    Line 39, "non measurement" should read -- non-measurement --.

COLUMN 9:
    Line 15, "channel CR5" should read -- channel CH5 --.
    Line 27, "CH5," should be deleted.
    Line 28, "number" should read -- numbers --.
    Line 30, "number" should read -- numbers --.
    Line 62, "value," should read -- values, --.
    Line 64, "value" should read -- values --.

COLUMN 10:
    Line 58, "the lens image plane to" should read -- that the lens image plane will --.

COLUMN 11:
    Line 15, "Application No. 2005 107740," should read -- Application No. 2005-107740, --.

Signed and Sealed this

Eleventh Day of November, 2008

JON W. DUDAS
*Director of the United States Patent and Trademark Office*